United States Patent
Bean, Jr. et al.

(10) Patent No.: US 11,725,974 B2
(45) Date of Patent: Aug. 15, 2023

(54) SYSTEMS AND METHODS FOR LIQUID-VOLUME MEASUREMENT IN IMMERSION-COOLED DEVICES

(71) Applicant: SCHNEIDER ELECTRIC IT CORPORATION, Foxboro, MA (US)

(72) Inventors: John H. Bean, Jr., Littlestown, PA (US); Cory D. Basden, Arnold, MO (US)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 0 days.

(21) Appl. No.: 17/664,434

(22) Filed: May 23, 2022

(65) Prior Publication Data

US 2022/0283014 A1    Sep. 8, 2022

Related U.S. Application Data

(63) Continuation of application No. 16/930,369, filed on Jul. 16, 2020, now Pat. No. 11,359,955.

(60) Provisional application No. 62/875,998, filed on Jul. 19, 2019.

(51) Int. Cl.
*G01F 23/80* (2022.01)
*H05K 7/20* (2006.01)

(52) U.S. Cl.
CPC ............ *G01F 23/804* (2022.01); *G01F 23/80* (2022.01); *H05K 7/20772* (2013.01)

(58) Field of Classification Search
CPC ........ G01F 23/00; G01F 23/80; G01F 23/804; H05K 7/20236; H05K 7/203; H05K 7/20809; H05K 7/20772
See application file for complete search history.

(56) References Cited

U.S. PATENT DOCUMENTS

| | | | |
|---|---|---|---|
| 7,059,167 B2 * | 6/2006 | Nestvall | G01F 25/22 73/1.73 |
| 8,184,436 B2 | 5/2012 | Campbell et al. | |
| 9,351,429 B2 | 5/2016 | Shelnutt et al. | |
| 9,921,622 B2 | 3/2018 | Shelnutt et al. | |
| 2010/0290190 A1 | 11/2010 | Chester et al. | |
| 2017/0273223 A1 | 9/2017 | Saito | |

OTHER PUBLICATIONS

Extended European Search Report from corresponding European Application No. 20186126.7 dated Dec. 16, 2020.

* cited by examiner

*Primary Examiner* — Manuel L Barbee
(74) *Attorney, Agent, or Firm* — Lando & Anastasi, LLP

(57) ABSTRACT

A level sensing module for use with a liquid immersion cooling system having a device chassis housing an electronic device, the level sensing module comprising a fluid level sensor, and a controller coupled to the fluid level sensor and configured to receive a signal from the fluid level sensor indicative of a height of dielectric fluid in the device chassis, receive a signal from a pump controller indicative of a volume of dielectric fluid provided to the device chassis, and generate a map of dielectric fluid volume within the device chassis based on the signal from the fluid level sensor and the signal from the pump controller.

23 Claims, 10 Drawing Sheets

| Fill Increment 422 | Increment Volume [mL] 424 | Total Height [mm] 426 | Height Change (Δh) [mm] 428 | Total Volume [L] 430 |
|---|---|---|---|---|
| #1 | 634 | 2 | 2 | 0.63 |
| #2 | 634 | 4 | 2 | 1.27 |
| #3 | 634 | 7 | 3 | 1.90 |
| #4 | 634 | 13 | 6 | 2.54 |
| #5 | 634 | 15 | 2 | 3.17 |

FIG. 4B

| Fill Increment 422 | Increment Volume [mL] 424 | Total Height [mm] 426 | Height Change ($\Delta_h$) [mm] 428 | Total Volume [L] 430 |
|---|---|---|---|---|
| #1 | 816 | 3 | 3 | 0.82 |
| #2 | 816 | 6 | 3 | 1.63 |
| #3 | 480 | 9 | 3 | 2.11 |
| #4 | 240 | 12 | 3 | 2.35 |
| #5 | 816 | 15 | 3 | 3.17 |

SYSTEMS AND METHODS FOR LIQUID-VOLUME MEASUREMENT IN IMMERSION-COOLED DEVICES

CROSS-REFERENCE TO RELATED APPLICATIONS

This application is a continuation of U.S. patent application Ser. No. 16/930,369 titled "SYSTEMS AND METHODS FOR LIQUID-VOLUME MEASUREMENT IN IMMERSION-COOLED DEVICES", filed on Jul. 16, 2020, which claims the benefit of U.S. Provisional Application Ser. No. 62/875,998 titled "SYSTEMS AND METHODS FOR LIQUID-VOLUME MEASUREMENT IN IMMERSION-COOLED DEVICES," filed on Jul. 19, 2019, which are hereby incorporated by reference in their entirety.

BACKGROUND OF INVENTION

Field of the Invention

Embodiments of the invention generally relate to liquid immersed electronic equipment, and more particularly, to monitoring the volume of the liquid in which the equipment is immersed.

Discussion of Related Art

Many electronic devices generate heat during operation and require a method of cooling to prevent the electronic device from overheating. One such method is liquid immersion cooling, which involves immersing the electronic device in a non-conductive dielectric fluid. Typical liquid immersion cooling methods include cycling dielectric fluid through a device chassis housing the electronic device and a heat exchanger to transfer heat generated by the electronic device. Transfer of the device-generated heat via the dielectric fluid allows for the electronic device to maintain a safe operating temperature.

SUMMARY

At least one aspect of the present disclosure is directed to a level sensing module for use with a liquid immersion cooling system having a device chassis housing an electronic device. The level sensing module includes a fluid level sensor, and a controller coupled to the fluid level sensor and configured to: receive a signal from the fluid level sensor indicative of a height of dielectric fluid in the device chassis, receive a signal from a pump controller indicative of a volume of dielectric fluid provided to the device chassis, and generate a map of dielectric fluid volume within the device chassis based on the signal from the fluid level sensor and the signal from the pump controller.

In one embodiment, the level sensing module includes a mounting bracket coupled to the controller and the fluid level sensor and configured to be mounted to the device chassis. In certain embodiments, the controller is configured to selectively send an alert of dielectric fluid loss based on the signal from the fluid level sensor.

In some embodiments, the controller is configured to receive a signal from a temperature sensor indicative of a temperature of the dielectric fluid in the device chassis. In certain embodiments, the controller is configured to use a temperature of the dielectric fluid to determine a mass of the dielectric fluid in the device chassis. In various embodiments, the controller is configured to update the map of dielectric fluid volume to compensate for at least one of dielectric fluid expansions or retractions based on a temperature of the dielectric fluid.

Another aspect of the present disclosure is directed to a non-transitory computer-readable medium storing thereon sequences of computer-executable instructions for monitoring dielectric fluid volume in a liquid immersion cooling system having a device chassis housing an electronic device. The sequences of computer-executable instructions including instructions that instruct at least one processor to send at least one first command to transfer a first volume of dielectric fluid into the device chassis and measure a first height of the dielectric fluid within the device chassis, send at least one second command to transfer a second volume of dielectric fluid into the device chassis and measure a second height of the dielectric fluid within the device chassis, generate a map of dielectric fluid volume within the device chassis based on the first and second volumes and the first and second measured heights, measure a total dielectric fluid height within the device chassis, and selectively send an alert of dielectric fluid loss based on a comparison of the total dielectric fluid height and the map of dielectric fluid volume.

In one embodiment, the sequences of instructions include instructions that cause the at least one processor to generate the map of dielectric fluid volume by determining delta height levels corresponding to the transfer of the first and second volumes of dielectric fluid. In certain embodiments, each of the first and second volumes of dielectric fluid occupy first and second regions within the device chassis. In various embodiments, the delta height levels correspond to levels of dielectric fluid displacement in the first and second regions.

In some embodiments, the sequences of instructions include instructions that cause the at least one processor to identify which of the first and second regions are impacted by the loss of dielectric fluid based on the comparison of the total dielectric fluid height and the map of the dielectric fluid volume. In certain embodiments, the sequences of instructions include instructions that cause the at least one processor to send the alert of dielectric fluid loss if the loss of dielectric fluid impacts the first region. In various embodiments, the sequences of instructions include instructions that cause the at least one processor to measure a temperature of the dielectric fluid in the device chassis. In some embodiments, the sequences of instructions include instructions that cause the at least one processor to determine a mass of the dielectric fluid in the device chassis using the temperature of the dielectric fluid.

Another aspect of the present disclosure is directed to a device chassis for use in a liquid immersion cooling system including an electronic device, and a level sensing module including a fluid level sensor and a controller coupled to the fluid level sensor, the controller configured to receive a signal from the fluid level sensor indicative of a height of dielectric fluid in the device chassis, receive a signal from a pump controller indicative of a volume of dielectric fluid provided to the device chassis, and generate a map of dielectric fluid volume within the device chassis based on the signal from the fluid level sensor and the signal from the pump controller.

In one embodiment, the device chassis includes a mounting bracket coupled to the level sensing module. In some embodiments, the controller is configured to selectively send an alert of dielectric fluid loss based on the signal from the fluid level sensor. In certain embodiments, the controller is configured to receive a signal from a temperature sensor indicative of a temperature of the dielectric fluid in the device chassis. In various embodiments, the controller is configured to use the temperature of the dielectric fluid to determine a mass of the dielectric fluid in the device chassis. In some embodiments, the controller is configured to update the map of dielectric fluid volume to compensate for dielectric fluid expansions and/or retractions based on the temperature of the dielectric fluid.

BRIEF DESCRIPTION OF DRAWINGS

Various aspects of at least one embodiment are discussed below with reference to the accompanying drawings, which are not intended to be drawn to scale. The drawings are included to provide illustration and a further understanding of the various aspects and embodiments and are incorporated in and constitute a part of this specification but are not intended as a definition of the limits of the disclosure. In the drawings, each identical or nearly identical component that is illustrated in various figures may be represented by a like numeral. For purposes of clarity, not every component may be labeled in every drawing. In the drawings:

FIG. 4B is a data table illustrating an example of measured/calculated dielectric fluid values in accordance with one embodiment;

DETAILED DESCRIPTION

Figure 1A:
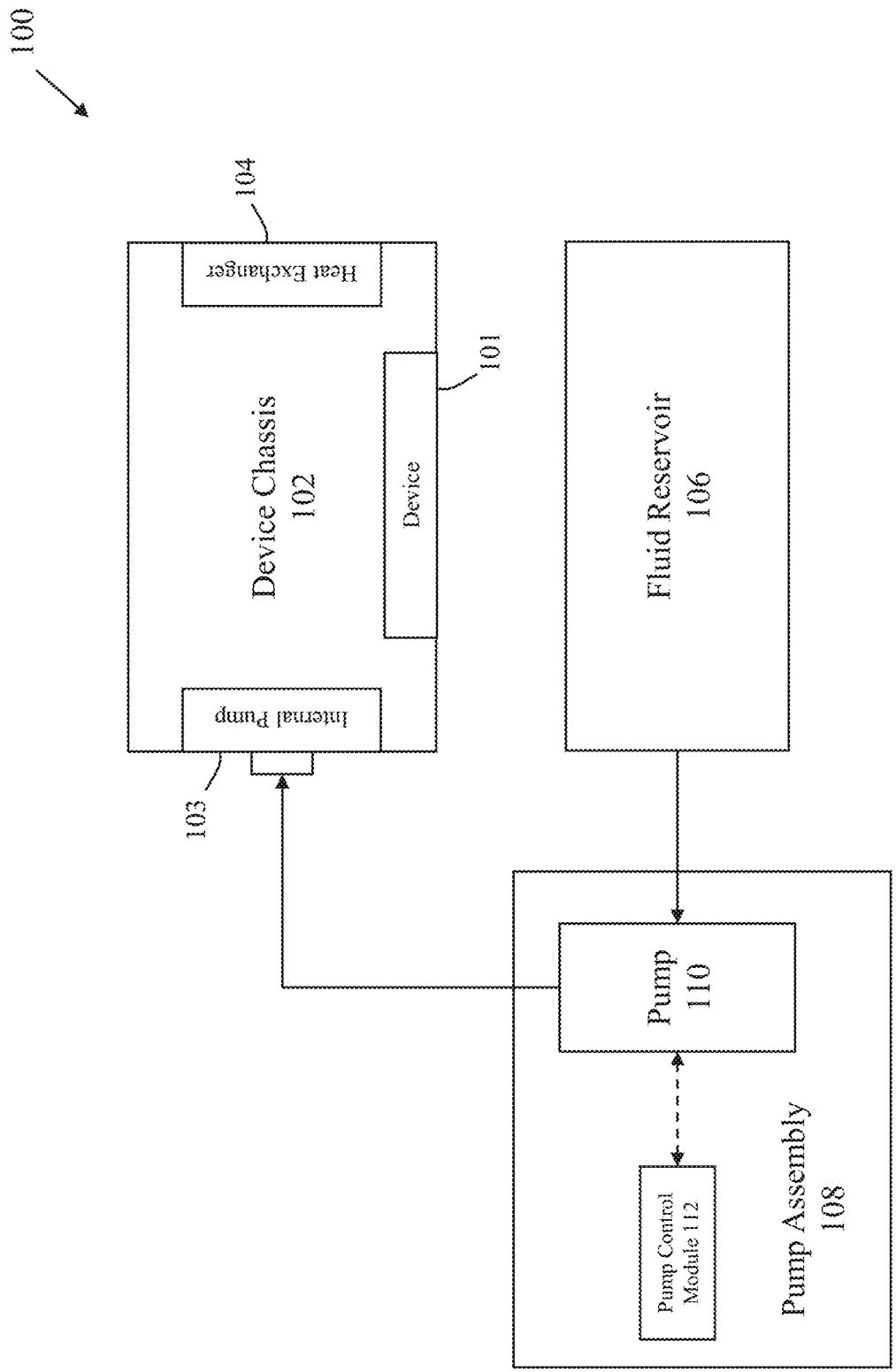
FIG. 1A is a functional block diagram of an example liquid immersion cooling system.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

As discussed above, electronic devices in operation can generate significant amounts of heat. In order to maintain device functionality, the operating temperature of the device is often maintained at an acceptable or desired operating temperature using various cooling methods. Some examples include allowing heat to be transferred via a heatsink and circulating air through the device or in proximity to the device. While these cooling methods have proven to be effective for some devices, for many devices such methods are inadequate for maintaining an acceptable device temperature. In addition, such methods often require expensive cooling infrastructures (e.g., air cooling) which operate with high energy usage rates.

As a result, demand has increased for efficient high-performance cooling methods. One such method is known as liquid immersion cooling. The liquid immersion cooling method includes immersing or submerging an electronic device in a non-conductive dielectric fluid. In a single-phase variation, the dielectric fluid is circulated via pumps within a chassis housing the electronic device. The dielectric fluid is then pumped through a heat exchanger to transfer heat generated by the device. In a two-phase variation, the dielectric fluid evaporates to transfer heat generated by the electronic device. The dielectric fluid, in gas form, is then cooled through a heat exchanger and returned to the chassis housing the device in liquid form.

FIG. 1A illustrates an example of a liquid immersion cooling system 100 that includes a device chassis 102, a heat exchanger 104 within the device chassis 102, a fluid reservoir 106, and a pump assembly 108. The device chassis 102 is configured to retain dielectric fluid, such that a device 101 within the device chassis 102 may be immersed in the dielectric fluid. The device may be a server or some other electronic device, such as storage devices, networking equipment, or other types of high heat flux electronic equipment. In some examples, more than one device may be positioned in the device chassis 102 and immersed in the dielectric fluid.

The pump assembly 108 includes a pump 110 and a pump control module 112. The pump control module 112 operates the pump 110 to transfer dielectric fluid from the fluid reservoir 106 into the device chassis 102. In some examples, the pump control module 112 may receive commands from a computing system, another control module, and/or a user.

Figure 1B:
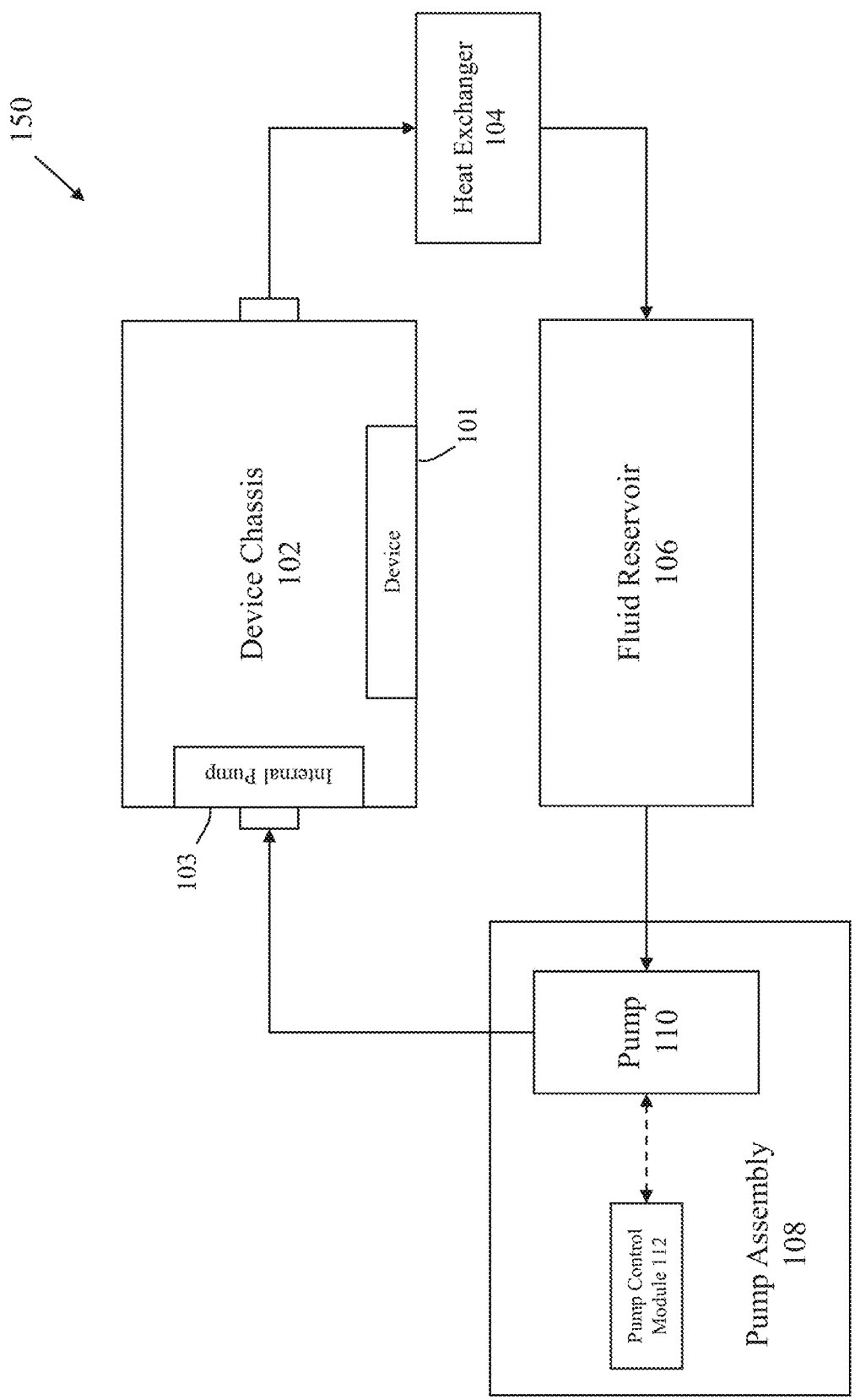
FIG. 1B is a functional block diagram of an example liquid immersion cooling system.

The device chassis 102 may include at least one internal pump 103 to cycle the dielectric fluid through the heat exchanger 104. As shown in FIG. 1A, the dielectric fluid may be cycled through the heat exchanger 104 to transfer heat generated by the device 101. Water, or another liquid, may be circulated through the heat exchanger 104 to remove heat from the dielectric fluid and out of the device chassis 102. FIG. 1B illustrates an example of a liquid immersion cooling system 150 in which the dielectric fluid may be cycled through an external heat exchanger 104, transferred to the fluid reservoir 106, and then returned to the device chassis 102. In some examples, the liquid immersion cooling system 150 may be a two-phase type system.

The dielectric fluid may be one of a number of different types of non-conductive liquids. In this context, "non-conductive" means incapable of conducting electricity at a level that may damage or harm the immersed device 101. In some embodiments, the dielectric fluid may be an engineered fluid having properties optimized for heat transfer. In one example, the type of dielectric fluid used may be selected based on the device 101 within the device chassis 102. In another example, the type of dielectric fluid used may be selected based on the environment of the immersed cooling system 100. Examples of dielectric fluids that may be used include engineered fluids, mineral oils, deionized water, etc.

During operation of the immersion cooling system 100, the device chassis 102 may experience instances of dielectric fluid loss, reducing the volume of dielectric fluid in the device chassis 102. For example, the dielectric fluid may seep or leak across a seal of the device chassis 102. In another example, the device chassis 102 may experience a seepage of dielectric fluid, in vapor form, across a seal separating dielectric vapor from another interface. In some examples, the device chassis 102 may be opened for service or maintenance, allowing dielectric fluid to evaporate into the air.

Since the device is immersed in the dielectric fluid, which will offset or displace the fluid, it can be difficult to accurately monitor fluid volume in the device chassis 102 in prior systems. In addition, many devices have irregular geometries, which can present additional challenges when attempting to monitor fluid volume, such as a miscalculation of fluid volume based on only fluid height. The inability to monitor fluid volume accurately can result in a failure to properly identify and assess potential issues (e.g., fluid loss), placing the immersed device 101 at risk of exceeding acceptable operating temperatures. In addition, attempting to correct issues identified with inaccurate monitoring techniques can result in expensive, wasteful usage of dielectric fluids.

Systems and methods for accurately monitoring dielectric fluid volume in a liquid immersed cooling system are provided herein. In at least one embodiment, a high-resolution map of dielectric volume within a chassis housing an electronic device is generated. More specifically, dielectric volume is mapped with respect to dielectric height such that changes in volume can be monitored accurately to assess overall system performance, identify potential leaks, and reduce operating cost.

Figure 2:
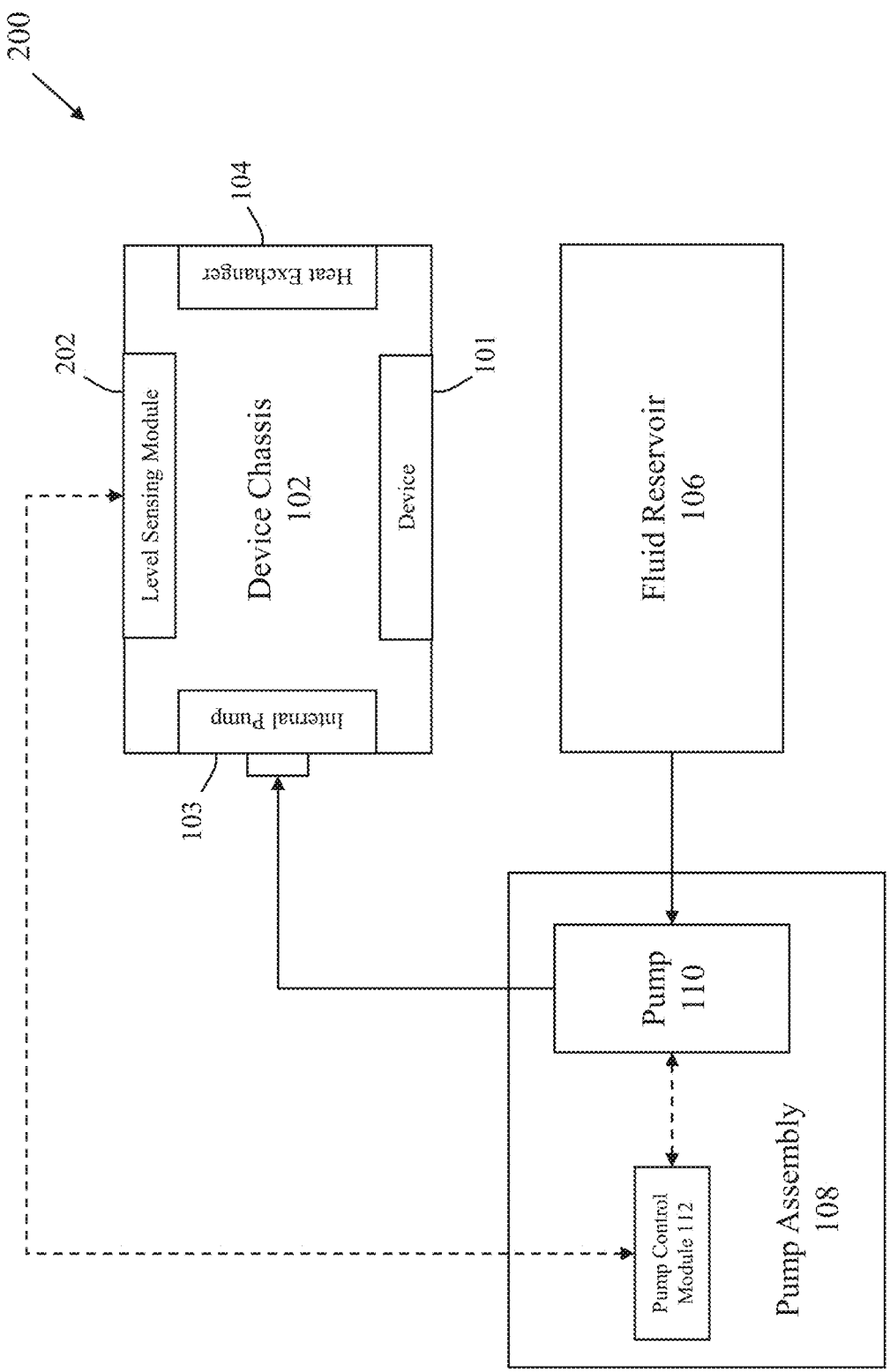
FIG. 2 is a functional block diagram of a liquid immersion cooling system in accordance with one embodiment.

FIG. 2 illustrates an example of a liquid immersion cooling system 200. The liquid immersion cooling system 200 comprises a level sensing module 202. In one embodiment, the level sensing module 202 is mounted within the device chassis 102; however, in other embodiments the level sensing module 202 may be mounted outside of the device chassis 102. In some embodiments, the level sensing module 202 may be shared between multiple device chassis and configured to provide similar functionality for each device chassis.

The level sensing module 202 may communicate with the pump control module 112 of the pump assembly 108. In one embodiment, by communicating with the pump control module 112, the level sensing module 202 may control operation of the pump 110. Likewise, the pump control module 112 may communicate with the level sensing module 202 to provide information to the level sensing module 202. In some examples, the pump control module 112 may provide information such as pump/flow rates and dielectric fluid parameters to the level sensing module 112. In some embodiments, the level sensing module 202 may be configured to communicate with one or more pump control modules to control multiple pumps associated with different device chassis.

As explained in greater detail below, the level sensing module 202 may control the operation of the pump 110 and obtain measurements of dielectric fluid height from a level sensor to map and monitor dielectric fluid volume within the device chassis 102.

Figure 3:
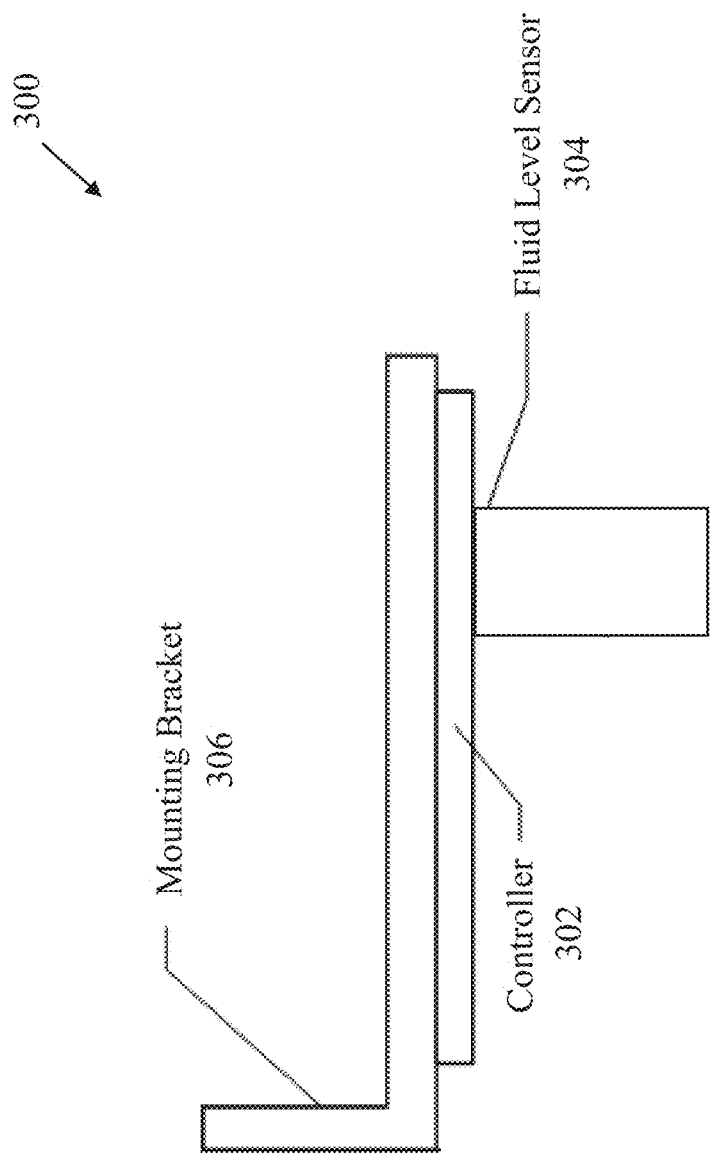
FIG. 3 is a schematic diagram illustrating an example of a liquid level assembly in accordance with one embodiment.

FIG. 3 is a schematic representation of one embodiment of a liquid level assembly 300. The liquid level assembly 300 may be used, for example, as the level sensing module 202 in the liquid immersion cooling system 200 shown in FIG. 2. The liquid level assembly 300 includes a controller 302 and a fluid level sensor 304. In one embodiment, the fluid level sensor 304 is mounted to the controller 302, and the controller 302 is mounted to a mounting bracket 306 inside a device chassis (e.g., device chassis 102). In other embodiments, the fluid level sensor 304 may be mounted inside of the device chassis 102 and the controller 302 may be located outside of the device chassis 102.

In various embodiments, the controller 302 may include one or more general computing processors, specialized processors, or microcontrollers. The controller 302 may include specially-programmed, special-purpose hardware, for example, an application-specific integrated circuit (ASIC), or more generally designed hardware, such as a field programmable gate array (FPGA) or a general purpose processor. In some embodiments, the controller 302 may be connected to one or more memory devices, such as a disk drive, memory, flash memory, embedded or on-chip memory, or other device for storing data. In some embodiments, the controller 302 may be one or more controllers including one or more components such as one or more processors.

The controller 302 may be configured to communicate with an external pump (e.g., pump 110) used to transfer dielectric fluid into the device chassis 102. The controller 302 may retain the volumetric flow rate of the pump 110 in memory, and control operation of the pump 110 (e.g., starting and stopping). The controller 302 may be configured to communicate with other devices and equipment such as a user interface device. In one embodiment, the controller 302 may communicate with the user interface device to enable a user to control operation of the pump 110. In some examples, the controller 302 may be configured to communicate with devices and equipment using a communication protocol such as $I^2C$, SPI, CANbus, or any other bi-directional protocol. In some embodiments, the controller 302 may communicate over wired connections, including a wired network. In other embodiments, the controller 302 may communicate over wireless connections, including a wireless network.

The controller 302 may be configured to communicate with the fluid level sensor 304 to receive measurements of dielectric fluid height within the device chassis 102. In one example, the fluid level sensor 304 includes a mechanical float and a strain gauge. A variable force is exerted upon the strain gauge from an attached float body immersed in the dielectric fluid, the magnitude of the variable force being dependent upon the percentage of the float body being immersed. As such, when dielectric fluid enters the device chassis 102, the fluid level increases around the stationary float, and a buoyancy force (i.e., variable force) is applied against the strain gauge. The controller 302 may know the density of the dielectric fluid, and may use the known density of the dielectric fluid to translate the buoyancy force into a fluid height value. In one embodiment, the controller 302 may store the measured fluid height values in memory. In some embodiments, the controller 302 may send the measured fluid height values to another device or interface, such as a user interface.

In some embodiments, the liquid level assembly 300 may be configured to monitor the dielectric fluid level of a multiple device chassis containing multiple electronic devices. For example, the liquid level assembly 300 may be configured to monitor the dielectric fluid level of a multiple device chassis located in an equipment rack (e.g., a server rack). Each device chassis in the equipment rack may include a fluid level sensor 304 coupled to the controller 302, and the controller 302 may be configured to monitor the dielectric fluid level of each device chassis in parallel.

In some embodiments, the liquid level assembly 300 may include additional sensors. For example, the liquid level assembly 300 may include a temperature sensor for measuring the temperature of the dielectric fluid, the device chassis 102, and/or the device 101. In one embodiment, the controller 302 may know thermophysical properties of the dielectric fluid, and may use the known thermophysical properties in combination with the temperature sensor to increase fluid level measurement accuracy. In some examples, the density of the dielectric fluid may vary over temperature and the controller 302 may adjust or calibrate values measured using the fluid level sensor 304. For example, a cooler, denser dielectric fluid may apply a greater buoyancy force against the strain gauge than a warmer, less-dense dielectric fluid for the same fluid level.

In some embodiments, the liquid level assembly 300 may include a pressure sensor for measuring the pressure of the dielectric fluid exerted on the base of the device chassis 102. In some examples, the controller 302 may use pressure measurements to increase fluid level measurement accuracy. In one embodiment, the pressure sensor may be an absolute pressure sensor; however, in other embodiments, the pressure sensor may be any other type of pressure sensor.

Embodiments discussed herein are not limited to a particular method of fluid level measurement, and the mechanical float-based approach described herein is merely provided as an example for illustrative purposes. For example, fluid level sensor 304 may utilize float, strain, optical, ultrasonic, capacitive, or any other level sensing method. Various types of fluid level sensors and implementations of fluid level measurement may be used and are within the scope of the invention.

Figure 4A:
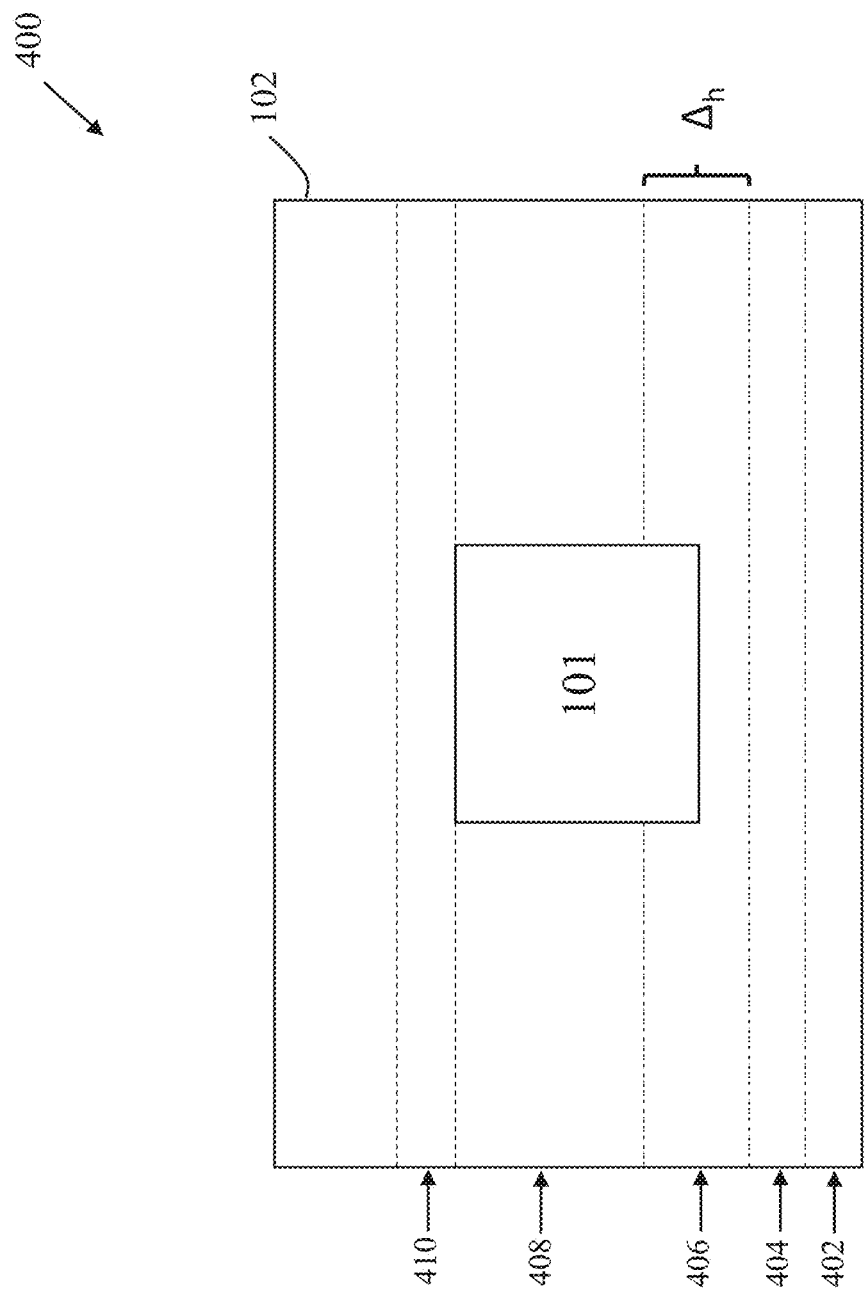
FIG. 4A is a diagram illustrating an example of a device chassis filled with dielectric fluid in accordance with one embodiment.

In an embodiment, fluid levels may be obtained to generate a high-resolution map of dielectric volume within a device chassis housing an electronic device. FIG. 4A is a diagram 400 illustrating one example of a chassis (e.g., device chassis 102) housing a device immersed in dielectric fluid (e.g., device 101). During an initial filling, dielectric fluid may be incrementally transferred into the device chassis 102, and the total fluid level may be measured after each subsequent transfer. For example, the fluid level of a first fluid increment 402 transferred into the device chassis 102 may be measured, the combined fluid level of the first fluid increment 402 and a second fluid increment 404 transferred into the device chassis 102 may be measured, and so on.

In one embodiment, each fluid increment may have a pre-determined volume. In some embodiments, the volume of each fluid increment may be the same; however, in other embodiments, the fluid increments may have different volumes. In one example, each fluid increment is transferred by running a pump (e.g., pump 110) for an amount of time corresponding to the pre-determined volume and the flow rate of the pump. In another example, fluid increments are defined as time intervals and the volume of fluid transferred during each interval is determined from the flow rate of the pump. In some examples, the dielectric fluid may be pumped continuously into the device chassis 102 and the volume of fluid transferred into the device chassis 102 may be sampled continuously, or at any time interval. The samples of fluid volume may be used to define fluid increments. For example, a fluid increment may be defined as the volume of fluid transferred into the device chassis 102 between two or more samples.

By measuring the total fluid level after each incremental transfer, a change in fluid height ($\Delta_h$) corresponding to each fluid increment may be determined. The $\Delta_h$ values corresponding to each fluid increment may be used to indicate levels of fluid displacement due to the immersed device 101 within the device chassis 102. For example, the $\Delta_h$ value corresponding to fluid increment 406 may be higher than the $\Delta_h$ value corresponding to the fluid increment 404, indicating a higher level of fluid displacement. Each fluid increment occupies a region of volume within the device chassis 102, and each $\Delta_h$ value may be used to determine the proximity of each region to the immersed device 101.

FIG. 4B is an example data table 420 of measured and calculated values from an initial fill of the device chassis 102. Column 422 represents each fluid increment shown in FIG. 4A. Column 424 represents the volume of each fluid increment transferred into the device chassis 102. Column 426 represents the total measured fluid level after the transfer of each fluid increment. Column 428 represents the change in fluid height ($\Delta_h$) corresponding to each respective fluid increment. In one example, the $\Delta_h$ value for each fluid increment may be calculated by subtracting the total measured fluid level pre-transfer from the total measured fluid level post-transfer. Column 430 represents the total volume of fluid in the device chassis 102 after the transfer of each fluid increment. In some examples, the total volume of fluid may be calculated by cumulatively adding the volume transferred into the device chassis 102 for each respective fluid increment (i.e., the cumulative sum of column 424).

Figure 4C:
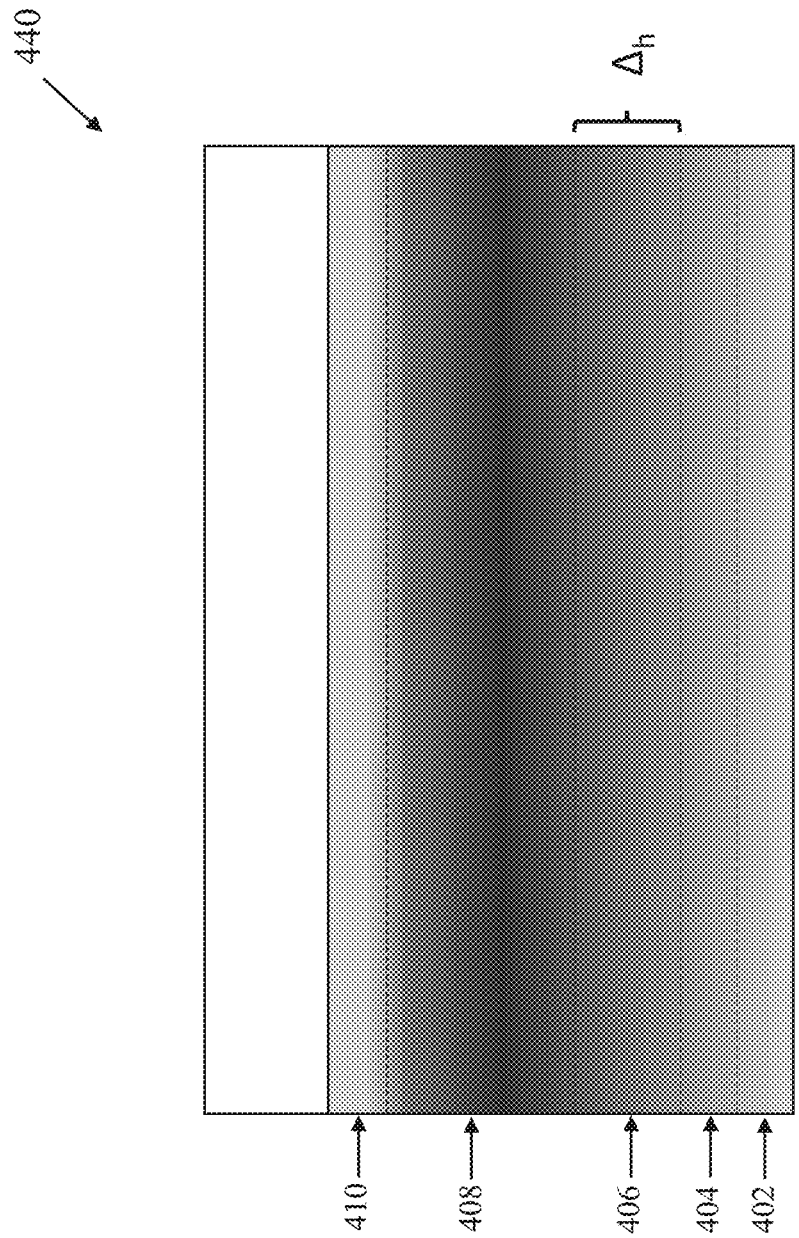
FIG. 4C is a diagram illustrating an example of a map of dielectric fluid volume within a device chassis in accordance with one embodiment.

The calculated $\Delta_h$ values shown in column 428 can be used to generate a high-resolution map of dielectric volume within the device chassis 102. FIG. 4C illustrates one example of a digital map 440 of device chassis 102. The digital map 440 may provide a true representation of dielectric fluid volume within the device chassis 102 including the immersed device 101. The digital map 440 may map dielectric volume with respect to the dimensions of the device chassis 102 (i.e., length, width, height). In one example, the $\Delta_h$ values in column 428 of data table 420 can be correlated to levels of density within the device chassis 102 and represented by the digital map 440. The color scale (or grey scale) in the digital map 440 represents the level of density per increment, where the dark regions represent high density (high $\Delta_h$) and the light regions represent low density (low $\Delta_h$). High density indicates that the fluid increment region is at least partially occupied by the immersed device 101.

Likewise, low density indicates that the fluid increment region is not in direct proximity to the immersed device 101.

Figure 4D:
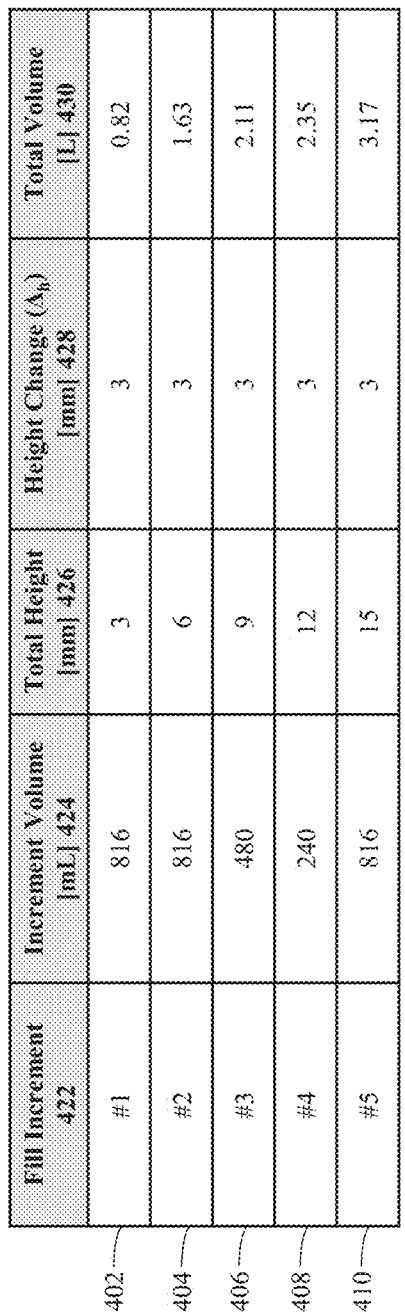
FIG. 4D is a data table illustrating an example of measured/calculated dielectric fluid values in accordance with one embodiment.

Alternatively, in some embodiments, during the initial filling of device chassis 102, dielectric fluid may be transferred in pre-determined increments of height, and the fluid volume for each increment may be determined by monitoring the timing and flow rate of the pump. In one example, the dielectric fluid height within the device chassis 102 may be measured to detect a pre-determined or expected change in fluid height ($\Delta_h$) for each fluid increment. FIG. 4D is an example data table 460 of measured and calculated values from an initial fill of device chassis 102 using pre-determined fluid height increments (Column 428). The calculated fluid volume increments shown in column 424 of data table 460 may be used to generate a high-resolution map of dielectric volume within the device chassis 102, similar to digital map 440. In one example, the increment volume values in column 424 of data table 460 can be correlated to levels of density within the device chassis 102 and represented by a digital map. For example, regions of high density may correspond to low increment volume values and regions of low density may correspond to high increment volume values.

The visual representation of the digital map 440 is provided herein for illustrative purposes. In some embodiments, the digital map 440 may be generated as a database, in a table, or in any other digital data format. In one example, the digital map 440 may be stored in a memory device, such as a memory device of the controller 302. In certain embodiments, a visual representation of the digital map 440 (e.g., FIG. 4C) may also be generated and provided to a user interface. By generating the digital map 440 of dielectric volume, accuracy in monitoring the dielectric fluid within the device chassis 102 may be improved.

Figure 5:
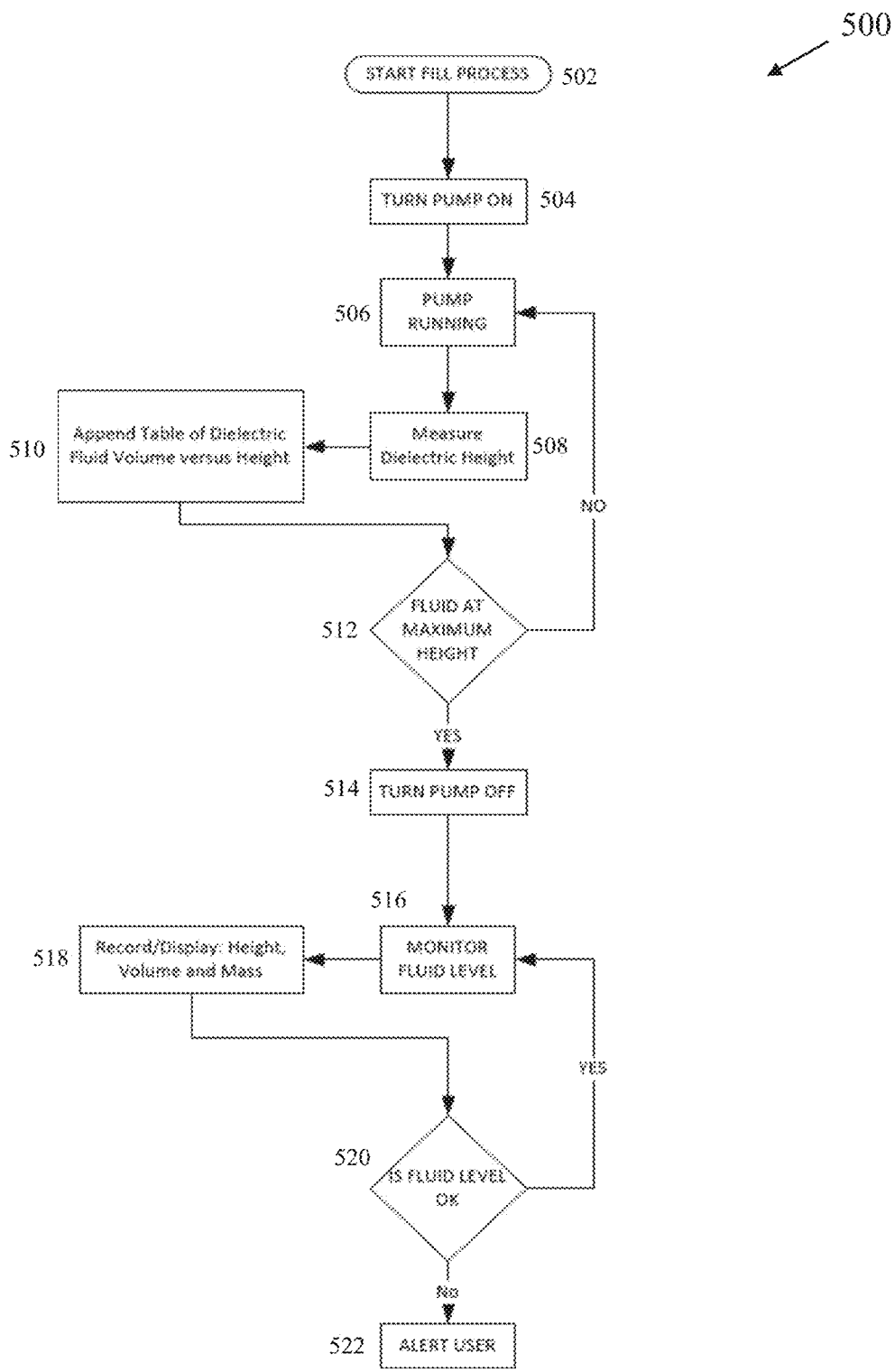
FIG. 5 is a diagram illustrating a process for mapping and monitoring dielectric fluid volume within a device chassis in accordance with one embodiment.

FIG. 5 is a flow chart illustrating a process 500 of monitoring fluid volume in a liquid immersed cooling system (e.g., liquid immersed cooling system 200). In one embodiment, the process 500 may utilize the level sensing module 202 to generate a digital map of dielectric fluid volume and monitor the dielectric fluid. The level sensing module 202 may be, for example, liquid level assembly 300 (as shown in FIG. 3).

At step 502, the controller 302 receives a command to begin the initial fill of dielectric fluid into the device chassis 102. In one embodiment, a user may initiate the initial fill process via a user interface. In other embodiments, the initial fill process may be initiated automatically using sensors, timers, etc. At step 504, after receiving the command to begin the initial fill process, the controller 302 communicates with pump assembly 108 via pump control module 112 and controls the pump 110 to turn on.

At step 506, the pump 110 transfers a first increment of dielectric fluid into the device chassis 102. The controller 302 monitors the pump 110 to determine when the first increment of dielectric fluid has been transferred into the device chassis 102. In one embodiment, the controller 302 may be provided with the volumetric flow rate of the pump 110, and may use the volumetric flow rate to determine an amount of fluid transferred into the device chassis 102 based on the run-time of the pump 110. In another embodiment, the controller 302 may communicate with a flow rate sensor configured to measure the volumetric flow rate of the pump 110 to determine the amount of fluid transferred into the device chassis 102.

At step 508, once the controller 302 has determined that the first increment of dielectric fluid has been transferred into the device chassis 102, the controller 302 measures the height of the dielectric fluid in the device chassis 102 using the fluid level sensor 304. At step 510, the controller 302 stores the measured fluid height level and the volume of fluid transferred into the device chassis 102. In one embodiment, the controller 302 may maintain a database or data table (e.g. data table 420) of stored measurement values. The controller 302 then checks at step 512 if the measured fluid height level is at a maximum fluid height level. In one embodiment, the maximum fluid height level may be determined based on the position of the fluid level sensor 304 in the device chassis 102. In some embodiments, the device chassis 102 may be filled entirely with dielectric fluid and the maximum fluid height level may be a dimension of the device chassis 102 (e.g., the height of the chassis). In other embodiments, the maximum fluid height level may be provided to the controller 302 by a user. If the measured fluid height level is at the maximum fluid height level, the controller 302 controls the pump 110 to turn off at step 514, otherwise the controller 302 returns to step 506, and a second increment of dielectric fluid is transferred into the device chassis 102.

The process of transferring increments of dielectric fluid into the device chassis 102 and measuring the corresponding fluid height level after each subsequent transfer repeats until the maximum fluid height level is reached and the pump 110 is turned off at step 514. By storing the measured fluid height and the total volume of fluid in the device chassis 102 after each pre-determined volume transfer, the controller 302 can calculate the change in fluid height ($\Delta_h$) corresponding to each transfer. The controller 302 may use the calculated $\Delta_h$ values to generate a digital map (e.g., digital map 440) of dielectric volume within the device chassis 102. In one example, the calculated $\Delta_h$ may be correlated to levels of density within the device chassis 102. For example, low $\Delta_h$ values may correspond to low density regions of the device chassis 102; i.e., regions unoccupied by the immersed device 101. Likewise, higher $\Delta_h$ values may correspond to high density regions of the device chassis 102; i.e., regions occupied by the immersed device 101.

Once the device chassis 102 has been filled and the controller 302 has generated the digital map 440, the controller 302 monitors the dielectric fluid in the device chassis 102. At step 516, the controller 302 measures the height of the dielectric fluid in the device chassis 102 using the fluid level sensor 304. At step 518, the processor 302 records the measured fluid level, and may use the digital map 440 to determine additional parameters. For example, the controller 302 may use the measured fluid level and the digital map 440 to determine the current volume of dielectric fluid in the device chassis 102. In some examples, the controller 302 may use the measured fluid level, the digital map 440, and properties of the dielectric fluid (e.g., temperature) to determine additional parameters such as the current mass of the dielectric fluid in the device chassis 102. In some embodiments, the controller 302 may provide the measured fluid level and/or the additional fluid parameters to be displayed on a user interface.

At step 520 the controller 302 checks if the measured fluid level is acceptable. In one embodiment, the controller 302 may use the digital map 440 to determine if the measured fluid level is acceptable. For example, the controller 302 may identify that the measured fluid level indicates a loss of dielectric fluid. The controller 302 may use the digital map 440 of the device chassis 102 to assess an amount of risk or urgency associated with the loss of dielectric fluid. The digital map 440 may indicate that the loss of dielectric fluid corresponds to a loss of fluid in a region of low density; i.e., not in direct proximity to the immersed device 101. In some embodiments, such an indication may not require an immediate response. However, the digital map 440 may indicate that the loss of dielectric fluid corresponds to a loss of fluid in a region of high density; i.e., in proximity to the immersed device 101, which may require an immediate response to prevent the immersed device 101 from exceeding an acceptable operating temperature. At step 522, the controller 302 sends an alert in response to a determination that the fluid level is unacceptable, otherwise the process returns to step 516, and the controller 302 continues to monitor the dielectric fluid in the device chassis 102.

As described above, in additional embodiments, during the initial filling of device chassis 102, dielectric fluid may be transferred in pre-determined increments of height, and the fluid volume for each increment may be determined by monitoring the timing and flow rate of the pump. As such, the process 500 of FIG. 5 may be adapted accordingly. For example, at step 506, the pump 110 transfers dielectric fluid into the device chassis 102. At step 508, the controller 302 may measure the height of the dielectric fluid in the device chassis 102 using the fluid level sensor 304 to determine when the first increment of dielectric fluid has been transferred into the device chassis 102. Once the controller 302 has determined that the first increment of dielectric fluid has been transferred into the device chassis 102, the controller 302 may calculate or measure the volume of the first increment of dielectric fluid. In one embodiment, the controller 302 may be provided with the volumetric flow rate of the pump 110, and may use the volumetric flow rate to determine the amount of fluid transferred into the device chassis 102 based on the run-time of the pump 110. In another embodiment, the controller 302 may communicate with a flow rate sensor configured to measure the volumetric flow rate of the pump 110 to determine the amount of fluid transferred into the device chassis 102.

At step 510, the controller 302 may store the calculated/measured volume of dielectric fluid transferred into the device chassis 102 and the measured fluid height level. In one embodiment, the controller 302 may maintain a database or data table (e.g. data table 460) of stored measurement values. The controller 302 may then checks at step 512 if the measured fluid height level is at a maximum fluid height level. If the measured fluid height level is at the maximum fluid height level, the controller 302 may control the pump 110 to turn off at step 514, otherwise the controller 302 returns to step 506, and a second increment of dielectric fluid is transferred into the device chassis 102. The process of transferring increments of dielectric fluid into the device chassis 102 and calculating/measuring the corresponding fluid volume after each subsequent transfer repeats until the maximum fluid height level is reached and the pump 110 is turned off at step 514. The controller 302 may use the calculated/measured volume values to generate a digital map (e.g., digital map 440) of dielectric volume within the device chassis 102.

Figure 6:
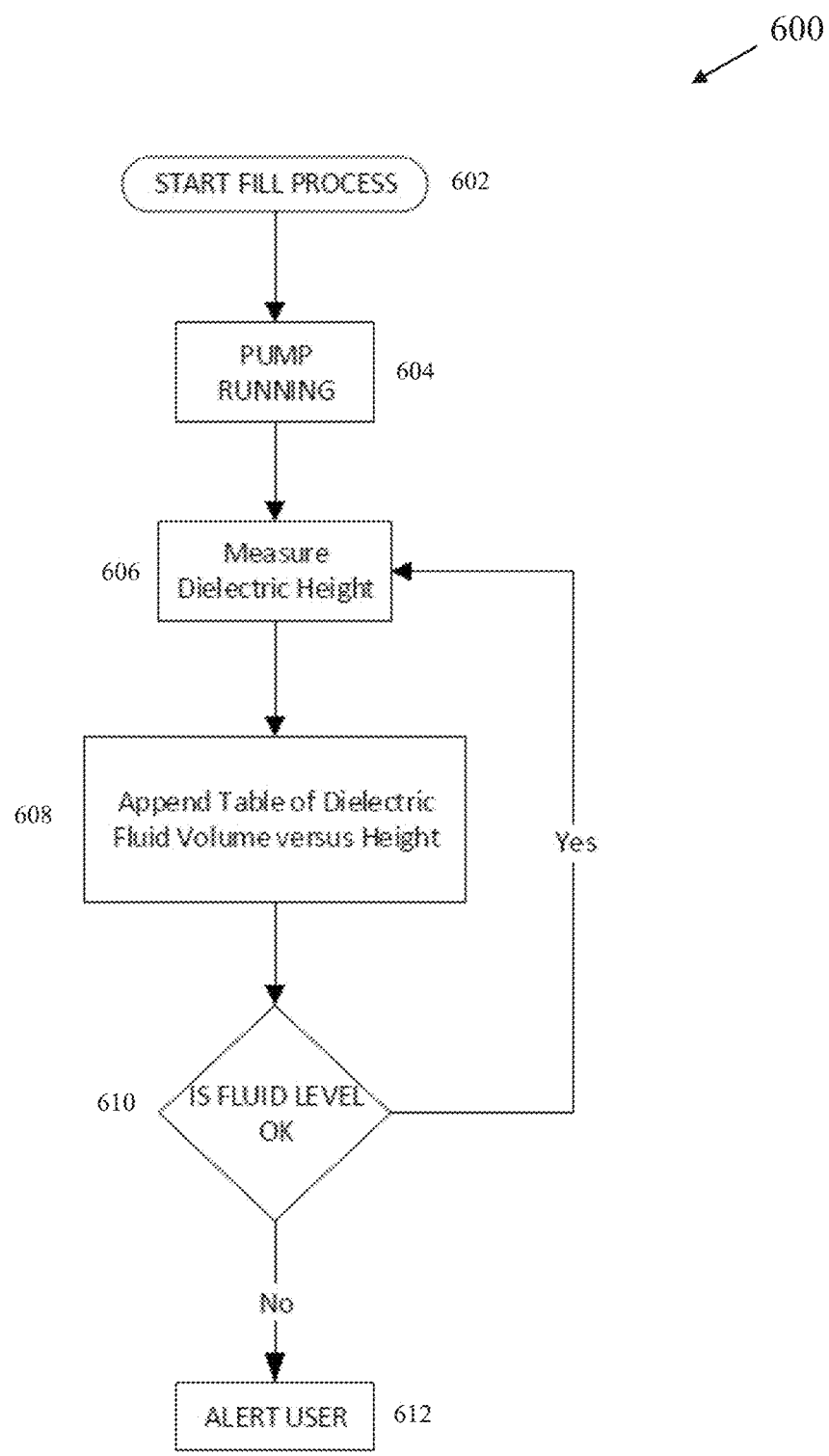
FIG. 6 is a diagram illustrating a process for mapping and monitoring dielectric fluid volume within a device chassis in accordance with one embodiment.

FIG. 6 is a flow chart illustrating another exemplary embodiment of monitoring fluid volume in a liquid immersed cooling system (e.g., liquid immersed cooling system 200). In one embodiment, the process 500 may utilize the level sensing module 202 to generate a digital map of dielectric fluid volume and monitor the dielectric fluid. The level sensing module 202 may be, for example, liquid level assembly 300 (as shown in FIG. 3).

At step 602, the controller 302 receives a command to begin the initial fill of dielectric fluid into the device chassis 102. At step 604, after receiving the command to begin the initial fill process, the controller 302 communicates with pump assembly 108 via pump control module 112 and controls the pump 110 to turn on. At step 606, the controller 302 measures the height of the dielectric fluid in the device chassis 102 using the fluid level sensor 304.

At step 610, the controller 302 stores the measured fluid height level and the volume of fluid transferred into the device chassis 102. The controller 302 may use the stored fluid height levels to generate and/or update a digital map (e.g., digital map 440) representing dielectric fluid volume within the device chassis 102. At step 610, the controller 302 checks if the digital map 440 indicates that the level of dielectric fluid in the device chassis 102 is acceptable. At step 612, the controller 302 sends an alert in response to a determination that the fluid level is unacceptable, otherwise the process returns to step 606, and the controller 302 continues to measure the height of the dielectric fluid in the device chassis 102.

The processes 500 and 600 both describe generating a digital map 440 representing dielectric volume and utilizing the digital map 440 to monitor the dielectric fluid within the device chassis 102. The digital map 440 provides a representation of dielectric volume within the device chassis 102, accounting for the displacement of fluid by the immersed device 101. By utilizing the digital map 440 to monitor the dielectric fluid, fluid loss can be accurately detected, and a need for any corrective action may be determined and initiated.

In some embodiments, the digital map 440 may be updated during the monitoring of the dielectric fluid. The controller 302 may be configured to update the digital map 440 to account for expected variations in fluid volume based on known properties of the fluid. For example, the controller 302 may receive or detect the temperature of the fluid and adjust the digital map 440 to account for thermal expansions/retractions of the fluid within the device chassis 102. Such adjustments may increase the accuracy of the fluid monitoring, reducing the likelihood of unnecessary corrective actions resulting in wasteful usage of dielectric fluids. In some embodiments, the controller 302 may also account for environmental parameters during the generation of the digital map 440, such as a temperature of the environment in which the liquid immersed cooling system 200 is located.

Additionally, in various embodiments, the controller 302 may track performance of the dielectric fluid over time. For example, the controller 302 may report performance metrics such as total fluid loss, fluid temperatures, variations of fluid volume, etc. to another device or interface, such as a user interface. In some embodiments, the controller 302 may log the occurrence of an event, such as a corrective action, and may monitor the performance of the dielectric fluid to assess the impact or effectiveness of the corrective action.

As described above, systems and methods for accurately monitoring dielectric fluid volume in a liquid immersed cooling system are provided herein. A high-resolution map of dielectric volume within a chassis housing an electronic device can be generated and utilized to monitor the dielectric fluid. By mapping dielectric volume with respect to dielectric height, changes in volume can be monitored accurately to assess overall system performance, identify potential leaks, and reduce operating cost.

Having thus described several aspects of at least one embodiment of this invention, it is to be appreciated various alterations, modifications, and improvements will readily occur to those skilled in the art. Such alterations, modifications, and improvements are intended to be part of this disclosure and are intended to be within the spirit of and

The invention claimed is:

1. A liquid level sensing system for an immersion cooling system having a device chassis, the liquid level sensing system comprising:
   a fluid pump having at least one volumetric flow rate and configured to provide dielectric fluid to the device chassis;
   a fluid level sensor configured to sense a height of dielectric fluid in the device chassis; and
   at least one controller configured to:
      provide a signal to the fluid pump, the signal instructing the fluid pump to provide dielectric fluid at the at least one volumetric flow rate to the device chassis;
      receive, at one or more time intervals, one or more height signals indicative of the height of the dielectric fluid in the device chassis from the fluid level sensor; and
      generate a map of the dielectric fluid in the device chassis based on the one or more time intervals, the one or more height signals, and the volumetric flow rate.

2. The liquid level sensing system of claim 1, wherein the controller is further configured to use a temperature of the dielectric fluid to determine a mass of the dielectric fluid in the device chassis.

3. The liquid level sensing system of claim 1 further comprising a mounting bracket.

4. The liquid level sensing system of claim 3, wherein the fluid level sensor includes a strain gauge having a mechanical float, the strain gauge being coupled to the mounting bracket.

5. The liquid level sensing system of claim 4, wherein the controller is coupled to the mounting bracket.

6. The liquid level sensing system of claim 4, wherein the mounting bracket is mounted within the device chassis.

7. The liquid level sensing system of claim 4, wherein the mechanical float applies a variable force to the strain gauge based on a height level of dielectric fluid in the device chassis.

8. The liquid level sensing system of claim 1, wherein the controller is further configured to update the map of dielectric fluid based on at least one thermophysical property of the dielectric fluid.

9. The liquid level sensing system of claim 1, wherein the controller is further configured to selectively provide an alert of dielectric fluid loss based on a comparison of the map of the dielectric fluid and the one or more height signals.

10. The liquid level sensing system of claim 1, wherein the liquid level sensing system includes a maximum fill height for the device chassis, and the controller is further configured to control the fluid pump to provide dielectric fluid to the device chassis responsive to the controller receiving a signal from the fluid level sensor indicating that the dielectric fluid is below the maximum fill height.

11. The liquid level sensing system of claim 10, wherein the controller is further configured to control the fluid pump to stop providing fluid to the device chassis when the controller receives a signal from the fluid level sensor indicating that the dielectric fluid in the chassis is above the maximum fill height.

12. A method of measuring fluid volume in a liquid immersion cooling system having a device chassis, the method comprising:
   controlling a fluid pump to provide dielectric fluid to the device chassis at a volumetric flow rate;
   receiving a first height signal indicative of a first height of the dielectric fluid in the device chassis;
   receiving a second height signal indicative of a second height of the dielectric fluid in the device chassis;
   generating a map of the dielectric fluid volume in the device chassis based on the volumetric flow rate, the first height signal, and the second height signal; and
   selectively generating an alert of dielectric fluid loss based on the map of the dielectric fluid volume and at least one height signal.

13. The method of claim 12, further comprising determining a mass of the dielectric fluid in the device chassis using a temperature of the dielectric fluid.

14. The method of claim 12, further comprising updating the map of the dielectric fluid volume to account for at least one thermophysical properly of the dielectric fluid.

15. The method of claim 12, wherein generating the map of the dielectric fluid in the device chassis further includes generating the map based on a time differential between controlling the fluid pump to provide dielectric fluid to the device chassis and receiving the first height signal.

16. The method of claim 15, wherein generating the map further includes generating the map based on a time differential between receiving the first signal and receiving the second height signal.

17. The method of claim 12, the method further comprising:
   determining a first height based on a first signal indicative of a first variable force applied to a strain gauge having a mechanical float.

18. The method of claim 17, the method further comprising:
   determining a second height based on a second signal indicative of a second variable force applied to the strain gauge having a mechanical float.

19. A non-transitory computer-readable medium storing thereon computer-executable instructions for measuring fluid level in an immersion cooling system having a device chassis, the instructions instructing at least one processor to:
   control a fluid pump to provide a volume of a dielectric fluid to the device chassis;
   generate a map of dielectric fluid volume in the device chassis, generating the map including:
      determining a fluid level of dielectric fluid in the device chassis based on a signal indicating fluid height level provided by a fluid level sensor, and
      determining a total volume of the dielectric fluid in the device chassis based on a signal indicating the fluid volume provided by the fluid pump; and
   selectively generate an alert of dielectric fluid loss based on a comparison of the fluid level of dielectric fluid in the device chassis and the map of dielectric fluid volume.

20. The non-transitory computer-readable medium of claim 19, the instructions further instructing the at least one processor to determine a mass of the dielectric fluid in the device chassis using a temperature of the dielectric fluid.

21. The non-transitory computer-readable medium of claim 19, the instructions further instructing the at least one processor to control a fluid sensor to take at least one reading of at least one thermophysical property of the dielectric fluid.

22. The non-transitory computer-readable medium of claim 21, the instructions further instructing the at least one processor to adjust the map of dielectric fluid volume by accounting for the at least one thermophysical property of the dielectric fluid.

23. The non-transitory computer-readable medium of claim 21, wherein the at least one thermophysical property of the dielectric fluid includes the temperature of the dielectric fluid.

* * * * *